US009638600B2

(12) United States Patent
Haywood (10) Patent No.: US 9,638,600 B2
(45) Date of Patent: May 2, 2017

(54) ELECTRICAL INTERCONNECT FOR PRESSURE SENSOR IN A PROCESS VARIABLE TRANSMITTER (71) Applicant: Rosemount Inc., Chanhassen, MN (US)

(72) Inventor: Nicholas John Haywood, Chanhassen, MN (US)

(73) Assignee: Rosemount Inc., Chanhassen, MN (US)

( * ) Notice: Subject to any disclaimer, the term of this patent is extended or adjusted under 35 U.S.C. 154(b) by 82 days.

(21) Appl. No.: 14/501,934

(22) Filed: Sep. 30, 2014

(65) Prior Publication Data

US 2016/0091382 A1    Mar. 31, 2016

(51) Int. Cl.
*G01L 19/00* (2006.01)
*G01L 9/00* (2006.01)

(52) U.S. Cl.
CPC ........ *G01L 19/0084* (2013.01); *G01L 9/0041* (2013.01); *G01L 9/0075* (2013.01); *G01L 19/0069* (2013.01)

(58) Field of Classification Search
CPC .................................................. G01L 19/0084
USPC .......................................................... 73/723
See application file for complete search history.

(56) References Cited

U.S. PATENT DOCUMENTS

| 3,480,036 | A | 11/1969 | Ehrens et al. | 137/318 |
|---|---|---|---|---|
| 4,161,887 | A | 7/1979 | Stone | 338/4 |
| 4,163,395 | A | 8/1979 | Medlar | 73/708 |
| 4,679,567 | A | 7/1987 | Hanlon et al. | 128/675 |
| 4,788,871 | A * | 12/1988 | Nelson | A23L 3/10 374/143 |
| 4,852,466 | A | 8/1989 | Freeman | 73/715 |
| 4,942,383 | A | 7/1990 | Lam et al. | 338/42 |
| 4,970,898 | A | 11/1990 | Walish | 73/706 |
| 5,000,047 | A | 3/1991 | Kato et al. | |
| 5,022,270 | A | 6/1991 | Rud, Jr. | 73/706 |
| 5,212,989 | A | 5/1993 | Kodama et al. | 73/706 |

(Continued)

FOREIGN PATENT DOCUMENTS

| CN | 1131462 | 9/1996 |
|---|---|---|
| CN | 1447096 | 10/2003 |

(Continued)

OTHER PUBLICATIONS

Invitation to Pay Additional Fees for International Application No. PCT/US2014/052660, dated Dec. 18, 2014.

(Continued)

*Primary Examiner* — John Fitzgerald
(74) *Attorney, Agent, or Firm* — Westman, Champlin & Koehler, P.A.

(57) ABSTRACT

A process fluid pressure sensor assembly includes a pressure sensor configured to sense a pressure of a process fluid. The assembly includes a pressure sensor body formed of an insulating material. The pressure sensor includes a plurality of electrical contact pads which couple to a pressure sensing element of the body of the pressure sensor. An interconnect body is configured to fit over an end of the pressure sensor body. A plurality of electrical connectors carried in the interconnect body are in electrical contact with the plurality of electrical contact pads. A wiring harness attaches to the interconnect body and includes a plurality of wires which are electrically connected to the plurality of electrical connectors.

18 Claims, 7 Drawing Sheets (56) References Cited

U.S. PATENT DOCUMENTS

| | | | | |
|---|---|---|---|---|
| 5,396,802 | A | 3/1995 | Moss | 336/30 |
| 5,463,904 | A | 11/1995 | Kalinoski | 73/719 |
| 5,524,492 | A | 6/1996 | Frick et al. | 73/706 |
| 5,637,802 | A | 6/1997 | Frick et al. | 73/724 |
| 5,665,899 | A | 9/1997 | Willcox | 73/1.63 |
| 5,668,322 | A | 9/1997 | Broden | 73/756 |
| 5,670,722 | A | 9/1997 | Moser | 73/718 |
| 5,680,109 | A | 10/1997 | Lowe et al. | 340/608 |
| 5,709,337 | A | 1/1998 | Moser | 228/124.6 |
| 5,731,522 | A | 3/1998 | Sittler | 73/708 |
| 6,038,961 | A | 3/2000 | Filippi et al. | 92/98 |
| 6,050,145 | A | 4/2000 | Olson | 73/706 |
| 6,079,276 | A | 6/2000 | Frick et al. | 73/718 |
| 6,082,199 | A | 7/2000 | Frick et al. | 73/724 |
| 6,089,097 | A * | 7/2000 | Frick | G01L 9/0075 361/283.4 |
| 6,151,557 | A | 11/2000 | Broden et al. | 702/47 |
| 6,253,624 | B1 | 7/2001 | Broden et al. | 73/861.44 |
| 6,354,152 | B1 * | 3/2002 | Herlik | G01N 29/223 73/597 |
| 6,425,290 | B2 | 7/2002 | Wilcox et al. | 73/715 |
| 6,457,367 | B1 | 10/2002 | Behm et al. | 73/753 |
| 6,473,711 | B1 | 10/2002 | Sittler et al. | 702/138 |
| 6,480,131 | B1 | 11/2002 | Roper et al. | 341/155 |
| 6,484,585 | B1 | 11/2002 | Sittler et al. | 73/718 |
| 6,505,516 | B1 | 1/2003 | Frick et al. | 73/718 |
| 6,508,129 | B1 | 1/2003 | Sittler | 73/756 |
| 6,516,671 | B2 | 2/2003 | Romo et al. | 73/718 |
| 6,520,020 | B1 | 2/2003 | Lutz et al. | 73/706 |
| 6,561,038 | B2 | 5/2003 | Gravel et al. | 73/729.2 |
| 6,568,274 | B1 | 5/2003 | Lucas | 73/718 |
| 6,662,662 | B1 | 12/2003 | Nord | 73/715 |
| 6,722,927 | B1 * | 4/2004 | Eriksen | G01L 19/0084 439/736 |
| 6,843,139 | B2 | 1/2005 | Schumacher et al. | 73/861.52 |
| 6,848,316 | B2 | 2/2005 | Sittler et al. | 73/706 |
| 6,883,380 | B2 * | 4/2005 | Romo | G01L 19/0061 73/715 |
| 6,901,803 | B2 | 6/2005 | Fandrey | 73/706 |
| 6,966,229 | B2 | 11/2005 | Seeberg | 73/754 |
| 7,000,478 | B1 | 2/2006 | Zwollo et al. | |
| 7,036,381 | B2 | 5/2006 | Broden et al. | 73/708 |
| 7,036,385 | B2 * | 5/2006 | Murai | G01L 19/0084 73/756 |
| 7,290,452 | B2 | 11/2007 | Hedtke | 277/317 |
| 7,409,867 | B2 | 8/2008 | Toy | 73/715 |
| 7,458,275 | B2 | 12/2008 | Kleven | 73/714 |
| 7,624,642 | B2 | 12/2009 | Romo | 73/717 |
| 7,819,014 | B1 | 10/2010 | Broden | 73/718 |
| 7,937,989 | B2 | 5/2011 | Marchesi | 73/299 |
| 7,962,294 | B2 | 6/2011 | Dozoretz et al. | 702/50 |
| 8,024,982 | B2 * | 9/2011 | Pettit | G01D 21/00 73/170.14 |
| 8,122,771 | B2 * | 2/2012 | Seeberg | G01L 19/0092 73/756 |
| 8,578,783 | B2 | 11/2013 | Hedtke et al. | 73/753 |
| 8,984,948 | B2 | 3/2015 | Becher | |
| 2002/0003917 | A1 * | 1/2002 | Sherrer | G01L 9/0079 385/12 |
| 2002/0023499 | A1 | 2/2002 | Boehler et al. | |
| 2002/0100333 | A1 | 8/2002 | Gravel et al. | 73/756 |
| 2003/0117837 | A1 | 6/2003 | Park et al. | 365/158 |
| 2003/0177837 | A1 | 9/2003 | Broden et al. | 73/716 |
| 2005/0193825 | A1 | 9/2005 | Otsuka | 73/715 |
| 2005/0248434 | A1 | 11/2005 | Kurtz et al. | 338/42 |
| 2006/0123933 | A1 * | 6/2006 | Braaten | G01F 1/74 73/866.5 |
| 2006/0162458 | A1 | 7/2006 | Broden | |
| 2006/0236775 | A1 | 10/2006 | Mei | 73/724 |
| 2008/0006094 | A1 | 1/2008 | Schulte et al. | 73/736 |
| 2008/0053242 | A1 | 3/2008 | Schumacher | 73/861.42 |
| 2008/0083283 | A1 * | 4/2008 | Takeuchi | G01L 19/0645 73/715 |
| 2008/0110269 | A1 | 5/2008 | Strietzel | 73/718 |
| 2008/0245158 | A1 | 10/2008 | Hedtke | |
| 2009/0000393 | A1 | 1/2009 | Nyfors et al. | 73/861.19 |
| 2009/0064803 | A1 * | 3/2009 | Pettit | G01D 21/00 73/866.5 |
| 2009/0165424 | A1 | 7/2009 | Lutz | |
| 2009/0249882 | A1 | 10/2009 | Kraatz | 73/708 |
| 2009/0293625 | A1 | 12/2009 | Sundet et al. | 73/708 |
| 2010/0064816 | A1 | 3/2010 | Filippi | 73/715 |
| 2010/0198547 | A1 | 8/2010 | Mulligan et al. | 702/100 |
| 2010/0281994 | A1 | 11/2010 | Brown | 73/729.1 |
| 2011/0247425 | A1 * | 10/2011 | Moldenhauer | G01L 19/0038 73/753 |
| 2012/0006119 | A1 | 1/2012 | Broden | 73/716 |
| 2012/0046870 | A1 | 2/2012 | Lievois et al. | 702/12 |
| 2012/0079884 | A1 * | 4/2012 | Broden | G01L 13/026 73/717 |
| 2013/0047737 | A1 | 2/2013 | Vagle | 73/716 |
| 2013/0068029 | A1 | 3/2013 | Romo | 73/706 |
| 2013/0074604 | A1 | 3/2013 | Hedtke et al. | |
| 2013/0160560 | A1 | 6/2013 | Strei et al. | 73/706 |
| 2013/0167961 | A1 | 7/2013 | Becher | 138/30 |
| 2013/0233058 | A1 | 9/2013 | Breen | 73/49.8 |
| 2014/0041437 | A1 | 2/2014 | Hedtke | 73/1.57 |
| 2014/0083171 | A1 | 3/2014 | Strei | 73/49.8 |
| 2014/0213103 | A1 | 7/2014 | Ohmeyer et al. | 439/571 |
| 2014/0260644 | A1 | 9/2014 | Sahagen | 73/708 |
| 2014/0298914 | A1 | 10/2014 | Vagle | 73/716 |
| 2015/0000417 | A1 | 1/2015 | Hedtke et al. | 73/724 |
| 2015/0260633 | A1 | 9/2015 | Hedtke | 73/862.637 |

FOREIGN PATENT DOCUMENTS

| | | |
|---|---|---|
| CN | 1777790 | 5/2006 |
| CN | 101802581 | 8/2010 |
| CN | 102162762 | 8/2011 |
| CN | 102356307 | 2/2012 |
| CN | 103017969 | 4/2013 |
| CN | 203069314 | 7/2013 |
| DE | 10 2010 041 170 | 3/2011 |
| EP | 1 116 943 | 6/2013 |
| JP | 02-141635 | 5/1990 |
| JP | 10-096656 | 4/1998 |
| JP | 10-160530 | 6/1998 |
| JP | 2002-022586 | 1/2002 |
| JP | 2011-123011 | 6/2011 |
| WO | WO 95/08759 | 3/1995 |
| WO | WO 01/61219 | 8/2001 |
| WO | WO 2010/141655 | 12/2010 |
| WO | WO 2011/000423 | 1/2011 |

OTHER PUBLICATIONS

International Search Report and Written Opinion of the International Searching Authority for International Application No. PCT/US2014/040632, dated Dec. 3, 2014.
Office Action from Chinese Application No. 201210506130.3, dated Jan. 14, 2015.
Product Data Sheet 00813-0100-4716, Rev. LA, Rosemount 3095 MultiVariable "The Proven Leader in Multivariable Mass Flow Measurement", dated Dec. 31, 2008.
Notification of Transmittal of the International Searching Report and the Written Opinion of the International Searching Authority from PCT/US2014/049019, dated Jan. 20, 2015.
International Search Report and Written Opinion of the International Searching Authority for International Application No. PCT/US2014/052660, dated Mar. 31, 2015.
Invitation to Pay Additional Fees for International Application No. PCT/US2013/029064, dated Apr. 16, 2014.
International Search Report and Written Opinion of the International Searching Authority for International Application No. PCT/US2013/029064, dated May 28, 2014.
Patent Examination Report No. 1 for Australian Patent Application No. 2013230135, dated Nov. 26, 2014, 3 pages.
Communication pursuant to Rules 161(1) and 162 EPC for European Patent Application No. 13710942.7-1610, dated Dec. 2, 2014, 2 pages.

(56) References Cited

OTHER PUBLICATIONS

Office Action from Australian Patent Application No. 2013230135, dated Apr. 2, 2015. Office Action from Australian Patent Application No. 2013230135, dated Apr. 2, 2015.
Office Action from U.S. Appl. No. 14/037,805, dated Jun. 15, 2015.
Office Action from Chinese Application Serial No. 201380007242.7, dated Apr. 28, 2015.
Office Action from Japanese Application Serial No. 2014-561027, dated Aug. 25, 2015.
"Corrosion Resistance of Hastelly Alloys", Haynes International, Inc., 1984, pp. 1-4 and 45.
Invitation to Pay Additional Fees along with Annex to Form PCT/ISA/206 Results of the Partial International Search from PCT/US2015/048821, dated Nov. 12, 2015.
"Application of Hardgrove Alloy C-276 Material in Chemical Pressure Vessel", by Li, Petrochemical Design, col. 20, No. 1, pp. 36-38, Dec. 31, 2003.
Office Action from Australian Application No. 2012359068, dated Jul. 15, 2014.
Office Action from Chinese Application No. 2012105061303, dated Jun. 10, 2014.
Office Action from European Application No. 12809549.4, dated Jul. 29, 2014.
International Search Report and Written Opinion of the International Searching Authority dated Jun. 5, 2013 for International Application No. PCT/US2012/070545, filed Dec. 19, 2012.
General Specifications EJX110A Differential Pressure Transmitter, Jan. 1, 2009. Retrieved from Internet: http://web.archive.org/web/20090407093933/http://www.yokogawa.com/fld/pdf/ejx/GS01C25B01-01E.pdf.
Hibner, E.L. and L.E. Shoemaker: "The Advantages of Nickel Alloys for Seawater Service, a New Generation of High Strength, Corrosion-Resistant Superalloy Products for Military Springs, Fasteners and Hardware". Special Metals Corporation, Huntington, WV 25705.
Fuji Electric—Differential Presure Transmitters for the Oil and Gas Industry. www.offshore-technology.com/contractors/instrumentation/fuji-electric/fuji-electric1.html.
Office Action from U.S. Appl. No. 13/630,547, dated Aug. 22, 2014.
Communication from European Patent Application No. 14734346.1, dated Feb. 4, 2016.
Communication from European Patent Application No. 14761526.4, dated May 4, 2016.
Office Action from Chinese Patent Application No. 201410363633.9, dated Jun. 13, 2016.
Office Action from Canadian Patent Application No. 2,866,380, dated Nov. 4, 2015.
Office Action from Russian Patent Application No. 2014140187, dated Nov. 9, 2015.
Office Action from U.S. Appl. No. 14/785,175, dated Sep. 16, 2015.
Office Action from U.S. Appl. No. 14/038,223, dated Sep. 29, 2015.
Office Action from U.S. Appl. No. 13/930,583, dated Feb. 1, 2016.
Office Action from U.S. Appl. No. 14/038,223, dated Jan. 28, 2016.
Office Action from Japanese Patent Application No. 2014-561027, dated Jan. 19, 2016.
Office Action from Chinese Patent Application No. 201410012367.5, dated Jan. 20, 2016.
International Search Report and Written Opinion of the International Searching Authority for International Application No. PCT/US2015/048821, dated Mar. 18, 2016.

\* cited by examiner

ELECTRICAL INTERCONNECT FOR PRESSURE SENSOR IN A PROCESS VARIABLE TRANSMITTER

BACKGROUND

Industrial process control systems are used to monitor and control industrial processes of the type used to produce or transfer fluids or the like. In such systems, it is typically important to measure "process variables" such as temperatures, pressures, flow rates, and others. Process control transmitters measure such process variables and transmit information related to the measured process variable back to a central location such as a central control room.

One type of process variable transmitter is a pressure transmitter which measures process fluid pressure and provides an output related to the measured pressure. This output may be a pressure, a flow rate, a level of a process fluid, or other process variable that can be derived from the measured pressure. The pressure transmitter is configured to transmit information related to the measured pressure back to the central control room or other location. Transmission is typically provided over a two-wire process control loop, however, other communication techniques may be used including wireless transmission.

Generally, the process pressure is coupled to the process variable transmitter through some type of process coupling. In many instances, a pressure sensor of the transmitter is fluidically coupled to the process fluid either through an isolation fluid or by direct contact with the process fluid. The pressure of the process fluid causes a physical deformation to the pressure sensor which generates an associated electrical change in the pressure sensor such as capacitance or resistance.

One particularly challenging environment for pressure measurement is applications which have a very high working pressure. One such application is the subsea environment. In such applications, the static pressure to which the process equipment is exposed can be quite high. Further, the process variable sensor may be exposed to a very broad range of temperatures. In such applications, various industry standard form factors are used for configuring the process variable transmitter. One typical configuration includes a pressure sensor positioned at a distal end of a probe. Transmitter electronics are carried in an electronics housing which is spaced apart from the probe. Electrical connectors extend from the electronics housing and couple to a pressure sensor carried in the probe. In many instances, it is difficult to reliably electrically connect to a process variable sensor carried at the distal end of the probe. Such connections may be difficult to achieve and may also be prone to failure. Further, in such configurations, size constraints may also present a challenge.

SUMMARY

A process fluid pressure sensor assembly includes a pressure sensor configured to sense a pressure of a process fluid. The assembly includes a pressure sensor body formed of an insulating material. The pressure sensor includes a plurality of electrical contact pads which couple to a pressure sensing element of the body of the pressure sensor. An interconnect body is configured to fit over an end of the pressure sensor body. A plurality of electrical connectors carried in the interconnect body are in electrical contact with the plurality of electrical contact pads. A wiring harness attaches to the interconnect body and includes a plurality of wires which are electrically connected to the plurality of electrical connectors.

This Summary and the Abstract are provided to introduce a selection of concepts in a simplified form that are further described below in the Detailed Description. The Summary and the Abstract are not intended to identify key features or essential features of the claimed subject matter, nor are they intended to be used as an aid in determining the scope of the claimed subject matter.

DETAILED DESCRIPTION OF ILLUSTRATIVE EMBODIMENTS

Figure 1:
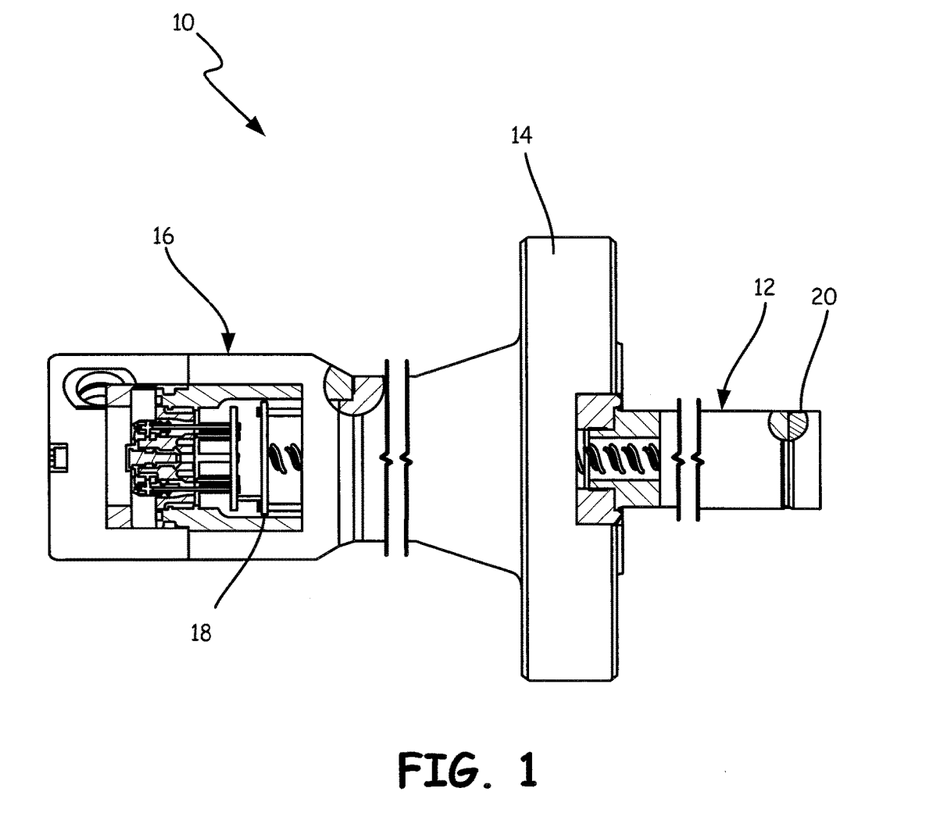
FIG. 1 is a side view of a process variable transmitter suitable for use in subsea oil and gas applications.

FIG. 1 is a partial cut away perspective view of one standard configuration of a process variable transmitter 10 for use in a subsea environment. Transmitter 10 can be used to sense process variables and transmit information related to a sensed process variable to another location. Example process variables which may be measured and transmitted included pressure and temperature. Transmitter 10 includes an elongate probe 12 and an electronics housing 16. A pipe flange 14 is configured for mounting the transmitter 10 to a process vessel such as a process pipe. The probe 12 is inserted into an opening in a pipe wall and used to position a process variable sensor 30 (not shown in FIG. 1) proximate process fluid in the process vessel. The process variable sensor 30 is carried in a sensor assembly 20 and may couple to the process fluid directly or through an isolation diaphragm. Interconnect wiring 32 extends from the process variable sensor 30 in the sensor assembly 20 to transmitter electronics 18 carried in the electronics housing 16. The probe 12 may typically vary in length from 0 to more than 13 inches depending upon the particular application. In order to provide accurate measurement, the process variable sensor 30 is typically positioned at the distal end of the probe 12. This reduces the amount of isolation fluid required and improves the accuracy in the sensed process variable. Further, in order to increase the life span and accuracy of the transmitter electronics 18, electronics 18 are typically spaced apart from the pipe flange 14 such that the electronics 18 may be maintained at a temperature which is less than or equal to 85° C. by sea water cooling of the housing 16. This may create a separation distance of more than 15 inches between the electrical connections on the process variable sensor 30 and the transmitter electronics 18.

In addition to being able to accommodate spacing variations between the process variable sensor 30 and the transmitter electronics 18, the electrical interconnect 32 to the sensor 30 should also be capable of operating over a broad range of temperatures, for example −46° C. to 204° C. As the electrical connection to the process variable sensor 30 occurs at the far distal end of the probe 12, the electrical connection experiences the full temperature range of the process fluid. Further, the electrical connection to the process variable sensor 30 may be required to be made in a very limited area. For example, the distal end of the probe 12 may have a diameter which is less than 1.25 inch. In addition, electrical noise or stray capacitance in the electrical connection between the transmitter electronics 18 and the process variable sensor 30 should be minimized in order to obtain accurate process variable measurements.

Figure 2:
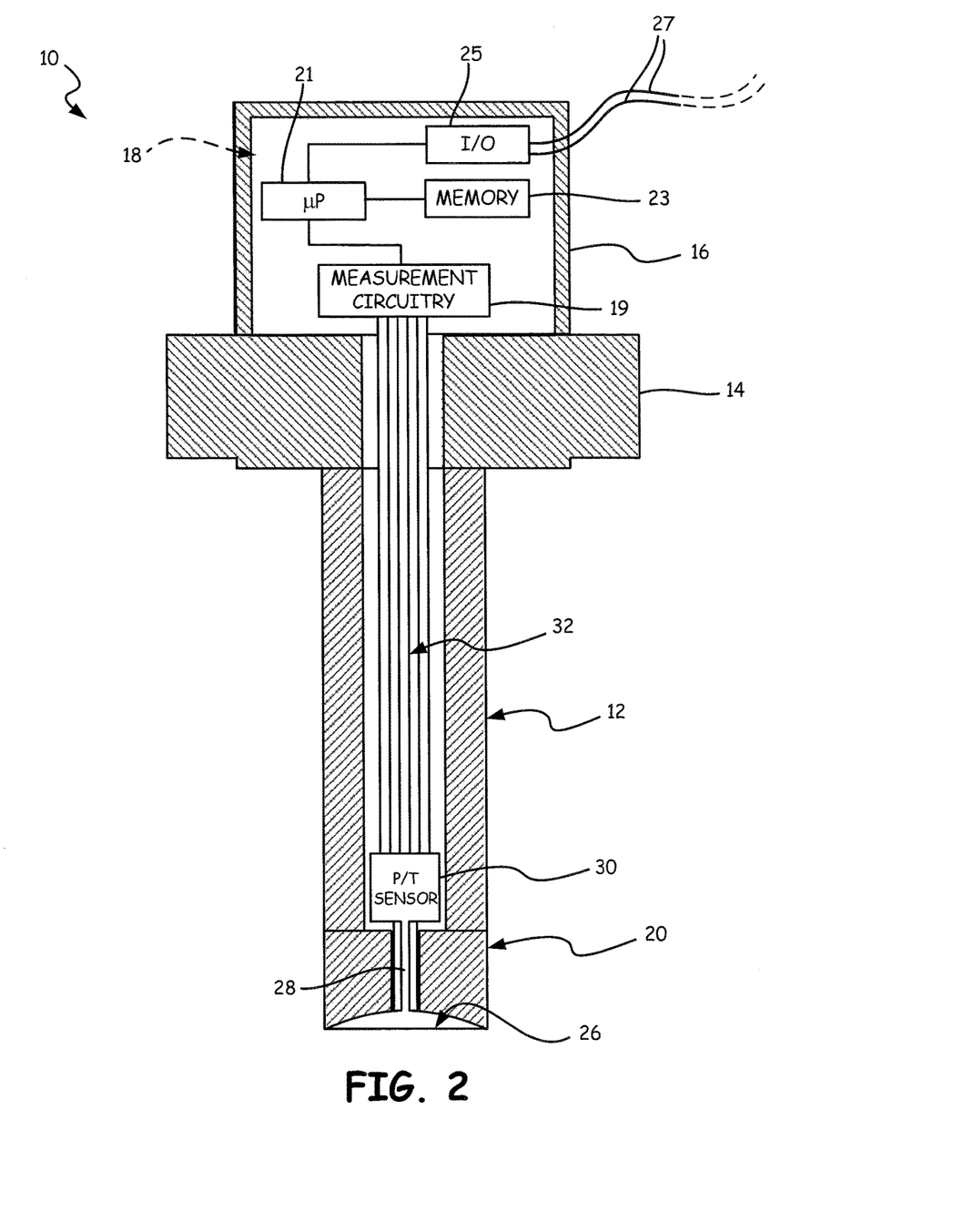
FIG. 2 is a simplified diagram of the transmitter of FIG. 1.

FIG. 2 is a simplified diagram showing process variable transmitter 10 including a process variable sensor 30. Electrical interconnect wiring harness 32 includes a plurality of wires and extends between the process variable sensor 30 and the transmitter electronics 18. In FIG. 2, the process variable sensor 30 is illustrated as a pressure and temperature sensor. Sensor 30 couples to the process fluid through an isolation diaphragm 26 and a capillary tube 28. An isolation fill fluid is carried in the space formed by capillary 28 and isolation diaphragm 26 to convey an applied pressure by the process fluid to the process variable sensor 30.

As illustrated in FIG. 2, transmitter electronics 18 includes measurement circuitry 19 coupled to sensor 30. For example, circuitry 19 can be configured to convert an output from a temperature sensor and an output from a pressure sensor into digital values which are provided to a microprocessor 21. Microprocessor 21 operates in accordance with instructions stored in a memory 23 and communicates using I/O circuitry 25. I/O circuitry can communicate over any appropriate communication medium including a two-wire process control loop 27. In some configurations, I/O circuitry 25 is also used to provide power to transmitter electronics 18 using power received from loop 27. Wireless communication may also be employed.

Figure 3:
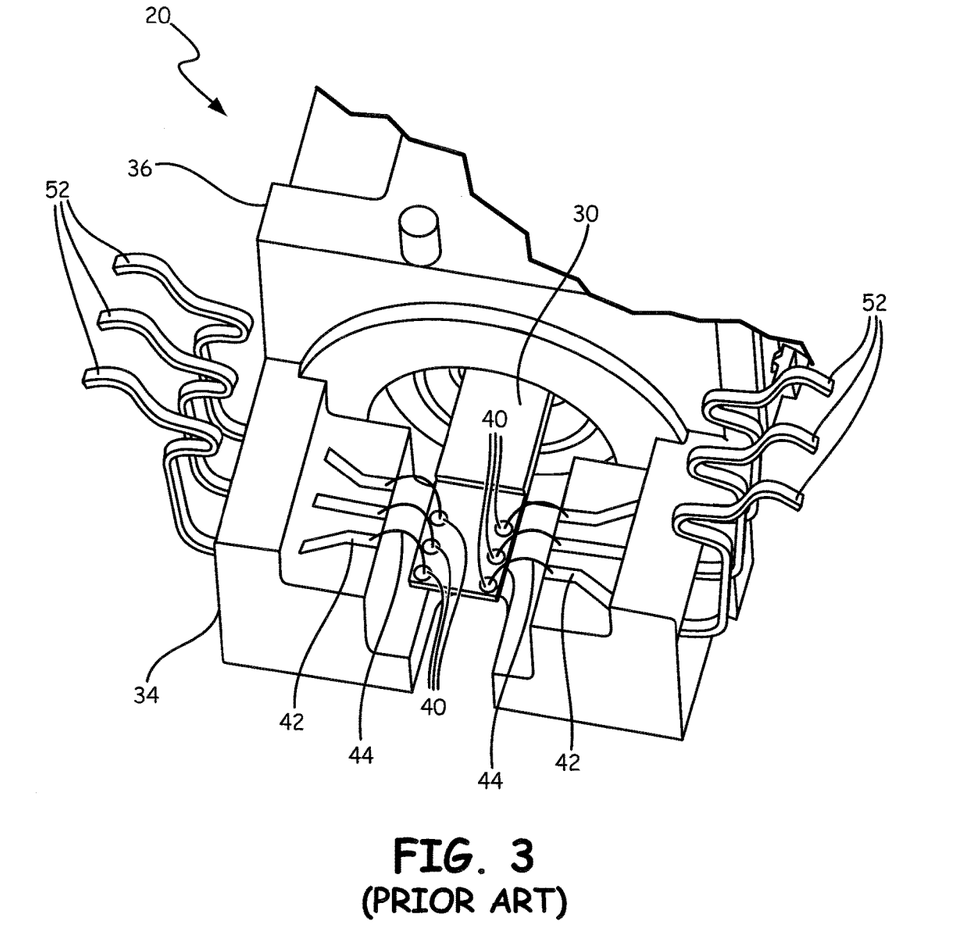
FIG. 3 is a perspective view showing a prior art technique for electrically connecting two a process variable sensor.

FIG. 3 is a partial perspective view showing an electrical connection made to process variable sensor 30 using a prior art technique. In FIG. 3, sensor assembly 20 includes a sensor lead frame body 36 having a lead frame body extension 34. A proximal end of sensor 30 carries electrical pads 40. Wire bonds 44 are used to electrically connect the pads 40 to extension traces 42 carried on extension 34. Extension traces 42 connect to extension leads 52. Electrical wires may be coupled to extension leads 52 and used to connect the process variable sensor 30 to transmitter electronics 18.

Figure 4:
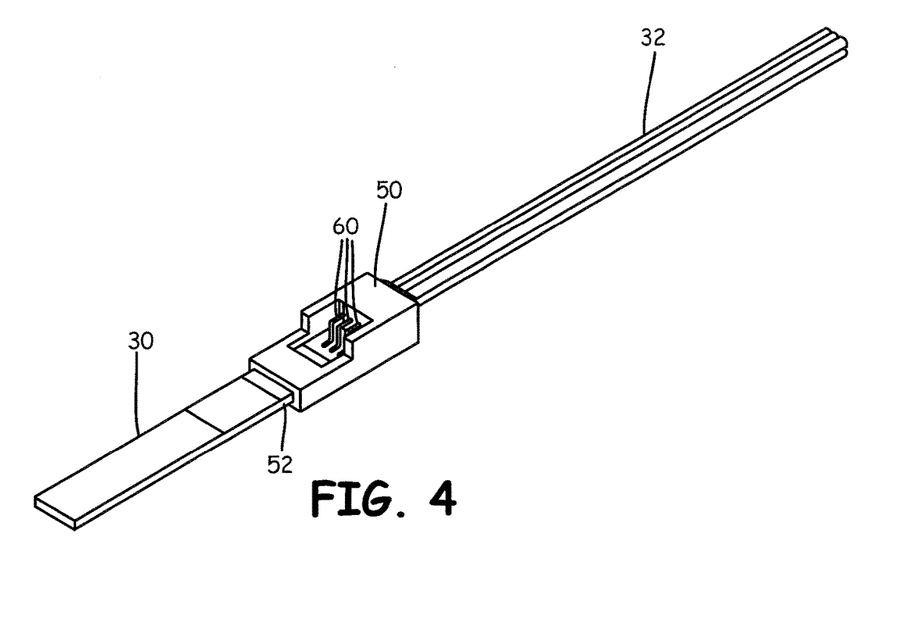
FIG. 4 is a perspective view showing an electrical interconnect body coupled to a process variable sensor.
Figure 5:
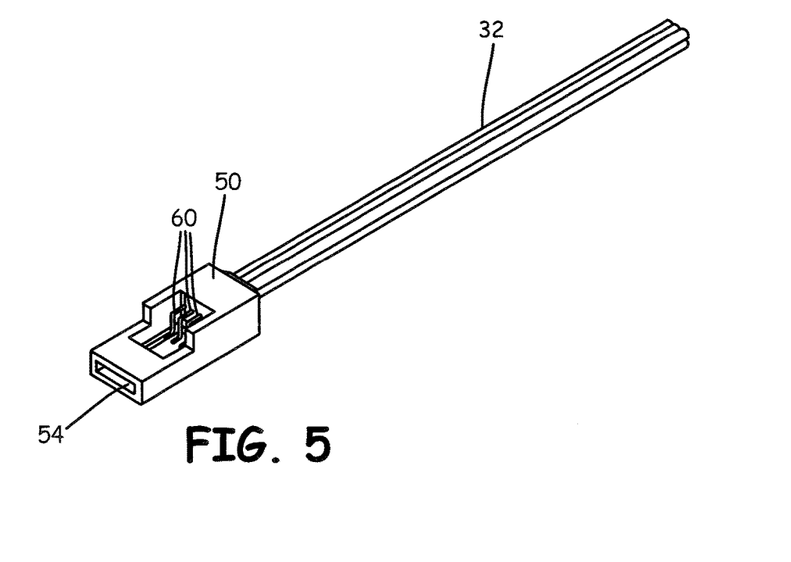
FIG. 5 is a perspective view of the electrical interconnect body of FIG. 4.

FIGS. 4 and 5 are perspective views showing an interconnect body 50 and a wiring harness 32 in accordance with one example embodiment. In FIG. 4, a proximal end 52 of sensor 30 is inserted into an interconnect body through an opening 54 (see FIG. 5). Electrical connectors 60 are electrically coupled to individual wires in wiring harness 32 and contact bond pads 40 on the proximal end 52 of sensor 30 which are illustrated in FIG. 3. The proximal end 52 of sensor body 30 may be secured in opening 54 through a friction fit or other attachment technique. For example, an adhesive may be used or the like. Bonding to the sensor 30 may be achieved using a high temperature adhesive such as Delomonopox® AD223 available by Delo Industrial Adhesives, LLC.

Figure 6:
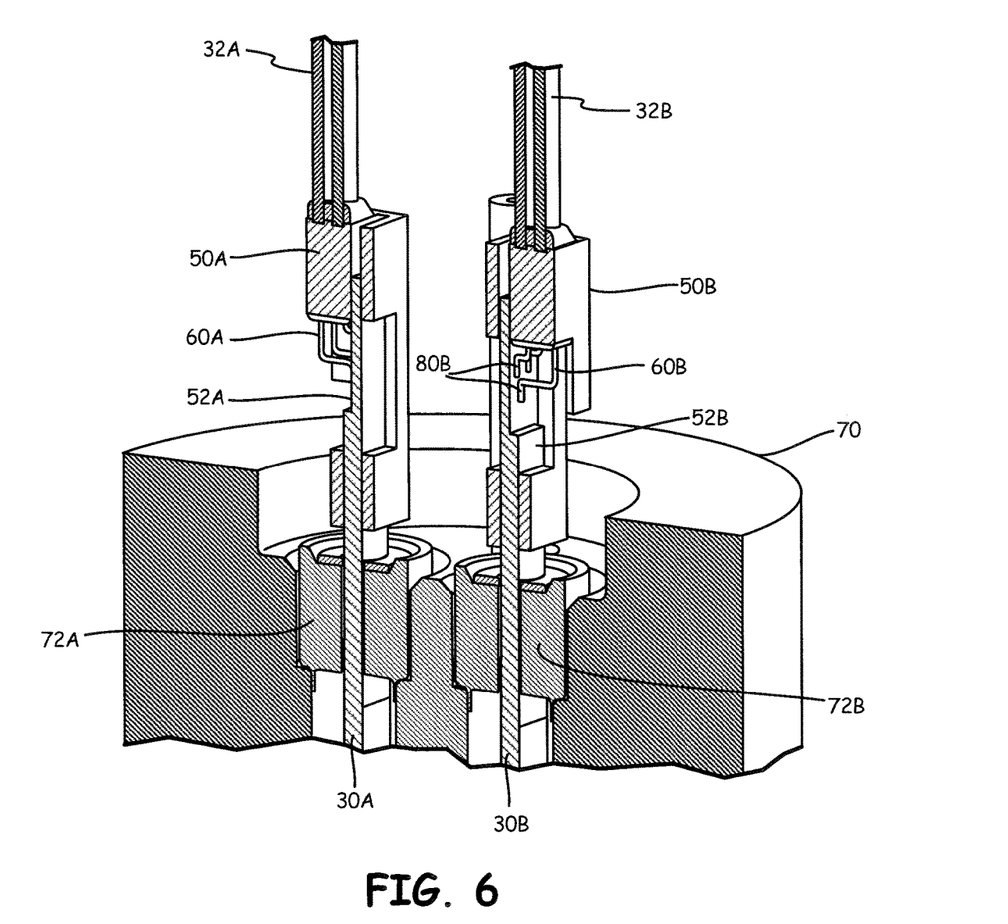
FIG. 6 is a perspective cross-sectional view showing two process variable sensors coupled to two respective electrical interconnect bodies.

FIG. 6 is a cutaway perspective view showing two process variable sensors 30A and 30B carried in a sensor capsule 70. In FIG. 6, pressure resistant sensor mounts 72A and 72B are used to mount respective sensors 30A and 30B. Interconnects 50A and 50B electrically connect wiring harness 32A, 32B to respective proximal ends 52A, 52B of sensors 30A, 30B. As illustrated with respect to interconnect 50B, electrical conductors 60B include attachment feet 80B. Feet 80B are configured to contact the pads 40 shown in FIG. 3 of sensor 30B. The connection may be through a spring loading of the feet 80B and may also include bonding such as through soldering, resistance welding, etc., of the electrical connection.

In the configuration illustrated in FIGS. 4-6, the interconnect body 50 and electrical connections may be coupled to the sensor 30 after the sensor 30 is mounted in the sensor capsule 70. Further, the individual wires in the wiring harness are configured as coaxial wires using coaxial conductors as an electrical shield. This reduces the amount of electrical wiring which is unshielded and thereby reduces interference from electrical noise sources as well as stray capacitance in the sensor signal. Further, the wire bonds 44 shown in FIG. 3 are eliminated. The size of the connector may be reduced as the six wires are attached in a two row staggered pattern.

Figure 9:
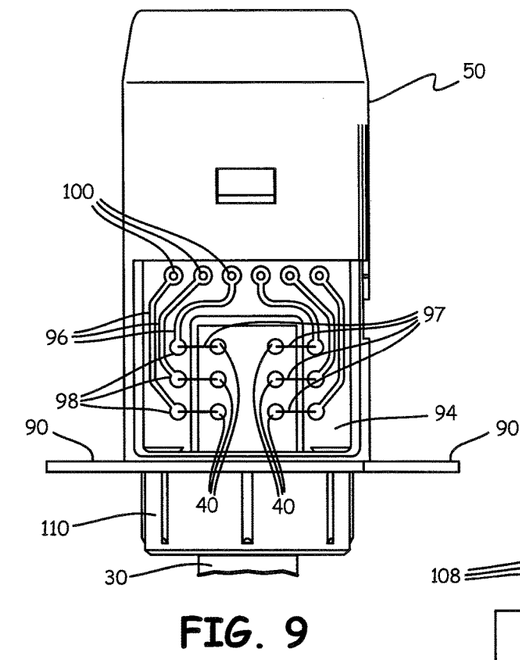
FIG. 9 is a top plan view of the electrical interconnect body of FIG. 8.
Figure 10:
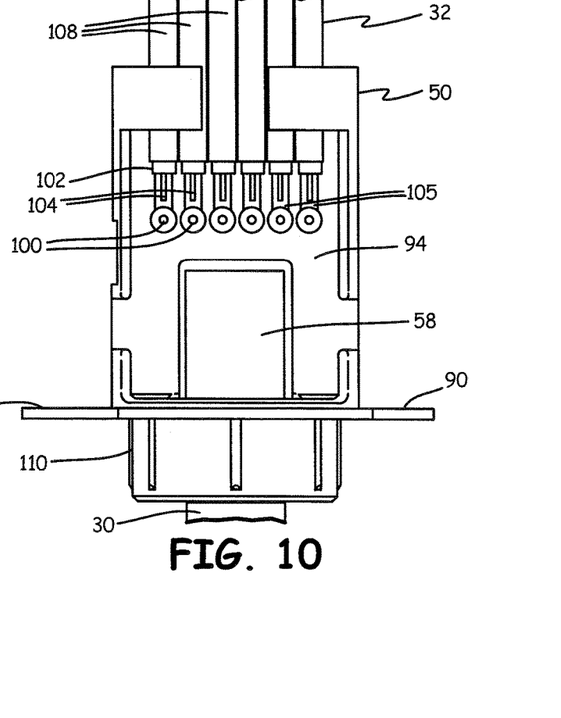
FIG. 10 is a bottom plan view of the electrical interconnect body of FIG. 8.

FIGS. 7, 8, 9 and 10 illustrate another example configuration of interconnect body 50. In this configuration, the interconnect body 50 includes sensor opening 54 configured to receive sensor 30 as illustrated in FIGS. 9 and 10. Interconnect body 50 includes mounting (or placement) tabs 90 for use when placing interconnect body over the proximal end 52 of sensor 30. Tabs 90 can also be bonded to sensor capsule 70 shown in FIG. 6.

In one configuration as illustrated in FIGS. 9 and 10, electrical traces 96, bond pads 98 and vias 100 are formed directly on interconnect body 50 through a deposition process such as laser direct structuring (LDS). However, other deposition processes may be implemented as well. For example, structuring interconnect body may include an optional interconnect circuit board 94 which carries electrical traces 96. Traces 96 include bond pads 98 which are used for wire bonding to bond pads 40 of sensor 30 by wire bonds 97. Traces 96 extend from pads 98 to vias 100 which connect to a bottom side of the circuit board 94 as illustrated in FIG. 10. Outer electrical conductors 102 of wiring harness 32 provide an outer shield and need not be electrically connected to interconnect body 50. In another example configuration, optional circuit board 94 may include a ground plane or the like whereby electrical connectors 102 of wiring harness 32 connect to electrical ground. A second electrical connector 104 of wiring harness 32 can be bonded to bonding pads 105 and electrically couple to a sense element at the distal end of sensor 30 through traces 96 and the connection to bond pads 40. The individual cables 108 of harness 32 may be configured as coaxial cables having an inner conductor and a coaxial outer shield.

Figure 7:
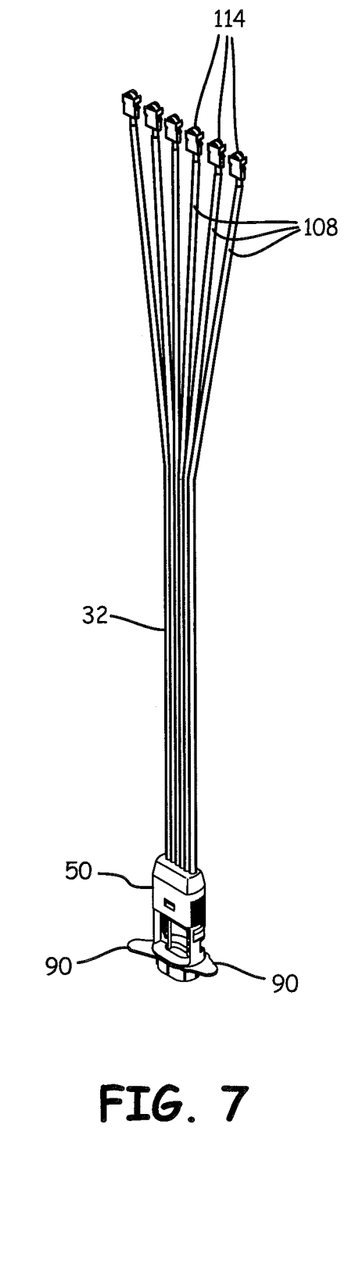
FIG. 7 is a perspective view of another example electrical interconnect.
Figure 8:
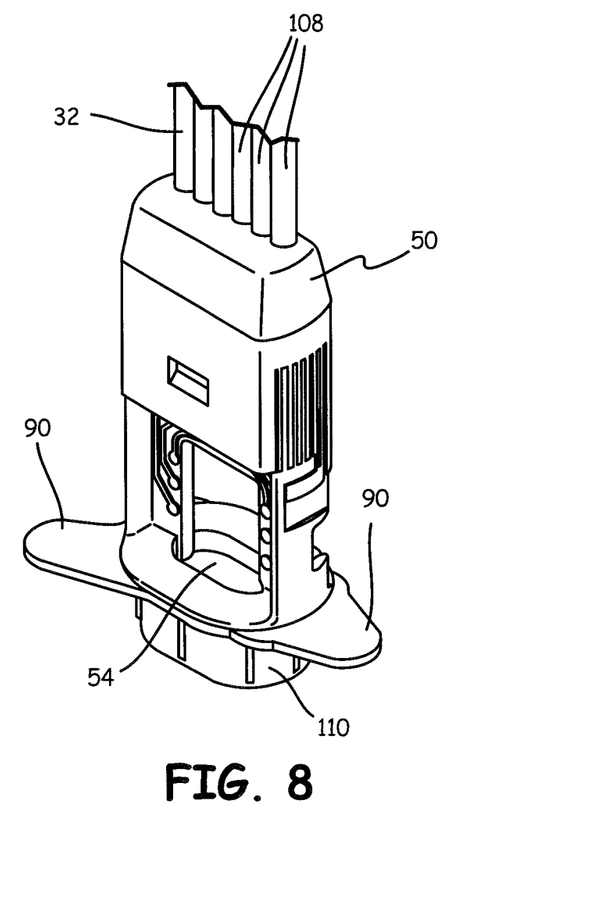
FIG. 8 is an enlarged perspective view of an electrical interconnect body shown in FIG. 7.

The sensor 30 is held securely within the sensor capsule 70 by sensor mount 72. In one configuration, the sensor 30 is held securely in the sensor mount 72. The interconnect body 50 is secured to the sensor capsule 70 whereby there is substantially no contact between the interconnect body 50 and the sensor 30 other than any electrical interconnect used to couple to the sensor 30. This ensures that minimal stress is placed on the sensor 30. A distal lip 110 of body 50 can provide a friction fit to the sensor capsule 70. In another example embodiment, an adhesive or other bonding material, or a friction fit, is used to secure interconnect body 50 to the sensor 30. As illustrated in FIG. 7, proximal connectors 114 are used for electrically connecting cables 108 to electronics 18. For example, connectors 114 may comprise miniature coaxial RF connectors. Wiring harness 32 can be formed of a ribbon cable having a desired length. This length may be the maximum length which may be necessitated for connecting the sensor 30 to the transmitter electronics 18. The electrical traces 96 may be formed using any appropriate technique including laser direct structuring (LDS). Tabs 90 can be configured as stainless steel or other material and used for welding or otherwise bonding the interconnect 50 to the sensor capsule 70 shown in FIG. 6. The body 50 may be formed using a plastic or the like through injection molding, for example. This laser direct structuring (LDS) is used to place electrical traces directly on a plastic connector body. The interconnect body 50 may be formed of any appropriate material including Liquid Crystal Polymer (LCP) or other high temperature plastic. The body 50 also provides a strain of relief to the wiring harness 32. Preferably, the coaxial cables are constructed to withstand high temperature and are fabricated from appropriate materials such as PFA and nickel-plated copper. The attachment technique may be used to electrically connecting wires including crimping, soldering or welding. The connector 50 may contain a potting material to provide strain relief to the wiring harness 32.

The sensor 30 may be in accordance with any desired sensing technology. In one specific configuration, the sensor 30 is formed of a body comprising insulating material and carries a pressure sensor and a temperature sensor therein. In a specific configuration, the body of sensor 30 is formed of a single crystal material and is in accordance with the sensor technology discussed in U.S. Pat. No. 6,089,097, issued Jul. 18, 2000 to Frick et al., entitled ELONGATE PRESSURE SENSOR FOR TRANSMITTER, commonly assigned herewith which is incorporated by reference in its entirety. In such a configuration, a cavity within the sensor body changes size as a function of the applied pressure. Capacitive plates provide a pressure sensing element and are mounted with respect to the cavity and have an electrical capacitance which changes as a function of cavity size. The capacitance can be measured and correlated to the applied pressure. Although six coaxial cables are specifically discussed above, the connections may also be made using unshielded wires. Further, the connections may be any combination of shield and unshielded wires. For example, unshielded electrical wires can be used for connecting to a temperature sensor for use in resistance measurement and coaxial cabling can be used to connect to a pressure sensor which has an electrical capacitance which changes in response to applied pressure. A metal mounting tab 90 may be included in the connector 50 for soldering or welding to the sensor 30. Body 50 may include a potting compound to provide strain relief to wiring harness 32.

Although the present invention has been described with reference to preferred embodiments, workers skilled in the art will recognize that changes may be made in form and detail without departing from the spirit and scope of the invention.

What is claimed is:

1. A subsea process variable transmitter, comprising:
    a transmitter housing;
    measurement circuitry located in the transmitter housing configured to measure a pressure of the process fluid;
    a flange configured to mount the transmitter housing to a subsea process system;
    an elongate probe configured to extend from the flange into the subsea process system;
    a process fluid pressure sensor assembly at a distal end of the probe, comprising:
        a pressure sensor configured to sense a pressure of a process fluid comprising a pressure sensor body, the pressure sensor including a plurality of electrical contact pads which couple to a pressure sensing element of the pressure sensor;
        an interconnect body which is separated from the elongate probe and fits over an end of the pressure sensor body;
        a plurality of electrical connectors carried in the interconnect body electrically coupled to the plurality of electrical contact pads and which are in direct abutting contact with the plurality of electrical contact pads; and
        a wiring harness attached to the interconnect body comprising a plurality of wires which are electrically connected to the plurality of electrical connectors, the wiring harness is configured to electrically connect the pressure sensor to the measurement circuitry in the transmitter housing.

2. The subsea process variable transmitter of claim 1 wherein at least one of the plurality of wires of the wiring harness comprises a coaxial cable.

3. The subsea process variable transmitter of claim 1 wherein the interconnect body includes an opening configured to receive a proximal end of the pressure sensor.

4. The subsea process variable transmitter of claim 1 wherein the pressure sensor includes a temperature sensing element electrically connected to the plurality of electrical contact pads.

5. The subsea process variable transmitter of claim 1 wherein the pressure sensor comprises an elongate body formed of a single crystal material.

6. The subsea process variable transmitter of claim 1 wherein a proximal end of the wiring harness includes a plurality of RF connectors configured to connect the plurality of electrical wires to transmitter electronics.

7. The subsea process variable transmitter of claim 1 wherein the interconnect body includes a distal lip configured to couple to a pressure sensor capsule which carries the pressure sensor.

8. The subsea process variable transmitter of claim 1 wherein the interconnect body includes a potting compounds configured to provide strain relief to the wiring harness.

9. The subsea process variable transmitter of claim 1 wherein the interconnect body includes at least one tab configured to be bonded to a sensor capsule which carries the pressure sensor.

10. The subsea process variable transmitter of claim 1 wherein the interconnect body is formed of a plastic.

11. The subsea process variable transmitter of claim 1 wherein the plurality of electrical connectors comprise traces which are deposited on the interconnect body.

12. The subsea process variable transmitter of claim 11 wherein the interconnect body includes a plurality of vias for connecting to the plurality of traces.

13. The subsea process variable transmitter of claim 1 wherein the plurality of electrical connectors comprise traces on a circuit board of the interconnect body.

14. The subsea process variable transmitter of claim 13 wherein the circuit board includes a plurality of vias for connecting to the plurality of traces.

15. The subsea process variable transmitter of claim 1 including a second pressure sensor connected to a second wiring harness by a second interconnect body.

16. The subsea process variable transmitter of claim 15 wherein the pressure sensor and the second pressure sensor are carried in a sensor capsule.

17. The subsea process variable transmitter of claim 1 wherein the plurality of electrical connectors include feet which are configured to electrically contact the electrical contact pads carried on the pressure sensor.

18. The subsea process variable transmitter of claim 17 wherein the feet are bonded to the electrical contact pads.

* * * * *